(12) United States Patent
Lee

(10) Patent No.: US 6,272,736 B1
(45) Date of Patent: Aug. 14, 2001

(54) METHOD FOR FORMING A THIN-FILM RESISTOR

(75) Inventor: Jia-Sheng Lee, Hsinchu (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/191,827

(22) Filed: Nov. 13, 1998

(51) Int. Cl.⁷ .................................................... H01C 17/06
(52) U.S. Cl. .......................... 29/620; 29/621.1; 427/101; 427/103
(58) Field of Search .............................. 29/610 R, 610.1, 29/621.1, 620, 621; 438/130, 276, 277, 278; 427/99, 101–103

(56) References Cited

U.S. PATENT DOCUMENTS

| | | | |
|---|---|---|---|
| 4,309,224 | * 1/1982 | Shabata | 29/567 |
| 4,602,421 | * 7/1986 | Lee et al. | 29/576 |
| 4,707,909 | * 11/1987 | Blanchard | 29/610 R |
| 4,746,896 | * 5/1988 | Mcquaid et al. | 29/610 R |
| 4,902,533 | * 2/1990 | White et al. | 427/99 |
| 4,975,386 | * 12/1990 | Rao | 29/620 |
| 5,610,083 | * 3/1997 | Chan et al. | 437/21 |
| 5,830,375 | * 11/1998 | Haung et al. | 216/84 |

* cited by examiner

*Primary Examiner*—Lee Young
*Assistant Examiner*—Sean Smith
(74) *Attorney, Agent, or Firm*—Charles C. H. Wu; Charles C. H. Wu & Associates

(57) ABSTRACT

A method for forming a thin-film resistor includes forming two insulators on the thin-film resistor, forming contact holes by performing wet etching processes, and forming interconnect and contact plugs at the same time. The invention also provides another method for forming a thin-film resistor that forms a thin-film resistor over the passivation layer instead. That is, forming a thin-film resistor on the top of the device, so that the resistance can be re-modified according to the actual needs.

30 Claims, 6 Drawing Sheets

METHOD FOR FORMING A THIN-FILM RESISTOR

BACKGROUND OF THE INVENTION

1. Field of the Invention

This invention relates to a semiconductor fabrication process, and more particularly, to a method for forming a thin-film resistor.

2. Description of Related Art

The resistor is one of the most common electrical components widely used in almost every electrical device. A semiconductor device, mostly an integrated circuit, including memories and logical devices normally consists of resistors and other electrical components. The resistance provided by a resistor is proportional to the length of the resistor and the reciprocal of the cross-sectional area of the resistor; both are measured in the direction of the current. That is, the resistance of a resistor fulfills the following equation:

$$R = L/A,$$

Wherein is the resistivity of the resistor, L and A are the length and the cross-sectional area of the resistor respectively, and wherein both L and A are measured in the direction of the current. Conventionally, doped polysilicon is used as the material of a resistor in a semiconductor fabrication process, wherein the resistance is controlled by predetermined L and A of the doped polysilicon layer.

As the integration of a semiconductor device is increased, all components within a semiconductor integrated circuit have to provide equivalent or better electrical properties. Hence, a downsized resistor still has to provide a required resistance. However, a conventional resistor made of doped polysilicon can only provide a limited resistance within a limited space because of the property of polysilicon. Using polysilicon resistor to provide a relatively high resistance then becomes a problem in designing and fabricating a highly integrated semiconductor device.

For overcoming the foregoing problem, new materials like SiCr having a higher resistivity than what of polysilicon are applied on the fabrication of a thin-film resistor of a highly integrated semiconductor device.

A conventional method for forming a thin-film resistor is illustrated in FIGS. 1A through 1I.

Referring to FIG. 1A, an insulator 102, a SiCr layer 104 and an aluminum layer 106 of about 2000 Å in thickness are formed on a substrate 100. The insulator 102 is made of borophosphosilicate glass (BPSG) for covering the substrate 100 and devices (not shown in figure) pre-formed thereon. The aluminum layer 106 is used to prevent the SiCr layer 104 from being damaged by the follow-up dry etching process.

A patterned photoresist layer 108 is formed to expose a portion of the aluminum layer 106, as shown in FIG. 1B. By performing a dry etching process, the aluminum layer 106 is patterned. Then, the patterned aluminum layer 106a is used as a mask in the follow-up patterning process to transfer the pattern onto the SiCr layer 104, as shown in FIGS. 1C and 1D.

Referring to FIG. 1E, contact holes 110 are formed in the insulator 102, and then, filled with a conducting layer 112, wherein the conducting layer 112 also covers the patterned aluminum layer 106a and the patterned SiCr layer 104a, a thin-film resistor.

Referring next to FIG. 1F, a patterned photoresist layer 114 is formed on the conducting layer 114 for defining interconnect. After performing a dry etching process to remove a portion of the conducting layer 112, as referring to FIG. 1G, a portion of unwanted remains 115 of the conducting layer 112 often resides next to the thin-film resistor 104a. The unwanted remains of the conducting layer 115 usually cause defects, such as a short circuit, that degrades the fabrication yield.

Referring to FIG. 1H, a patterned photoresist layer 116 is formed on the substrate 100 to cover the top and lateral surfaces of the interconnect 112. By using the photoresist layer 116 as a mask, the aluminum layer 106a is removed by a wet etching process. As shown in FIG. 1I, after the photoresist layer 116 is removed, the fabrication process of a thin-film resistor is then accomplished.

Normally, the resistance of a thin-film resistor needs to be further precisely determined by a laser cutter according to a measured result on the electrical property of the thin-film resistor 104a. Then, a follow-up metallization process is performed to connect the well-defined thin-film resistor to other devices.

Though a thin-film resistor of SiCr is able to provide a relatively high resistance without occupying a large space as a polysilicon resistor does, there are still drawbacks according to the conventional process of forming a thin-film resistor.

Since the space 117 between the interconnect 112 and the thin-film resistor 104a is limited according to the increased integration of a semiconductor device, the photoresist layer 116 can not either expose the entire aluminum layer 106a or fully cover the interconnect 112. In the case that the aluminum layer 106a is not fully exposed, it can not be totally removed from the top of the thin-film resistor 104a. Therefore, the remaining aluminum on the thin-film resistor 104a degrades the performance of the thin-film resistor 104a. The remaining conducting material 115 further causes defects such as a short circuit that suppresses the fabrication yield.

On the other hand, once the photoresist layer 116 can not fully cover the interconnect 112, the lateral portion of the interconnect 112 can be etched away by the follow-up etching process. Hence, a defect like an opened circuit occurs.

Even though the aluminum layer is capable of protecting the thin-film resistor from the damages caused by dry etching processes, the provided protection is limited. Normally, the thin-film resistor still get damaged by the dry etching process even in the presence of the aluminum layer if more than two dry etching processes are performed.

Furthermore the conventional method for forming a thin-film resistor contains numerous steps and requires new equipment, so it is time-consuming and not costefficient In addition, the conventional method for forming a thin-film resistor can not be re-modified once the follow-up metallization process is done.

SUMMARY OF THE INVENTION

It is therefore an objective of the present invention to provide a method for forming a thin-film resistor that forms the interconnect and contact plugs at the same time to prevent the thin-film resistor and the interconnects from being damaged by follow-up process.

It is another an objective of the present invention to provide a method for forming a thin-film resistor that can be applied on a fabrication process of a narrower line width.

It is still another objective of the present invention to provide a method for forming a thin-film resistor that contains less steps to shorten the fabrication process, that is, more cost-efficient and less time-consuming.

It is still another objective of the present invention to provide a method for forming a thin-film resistor that can be accomplished by using existing equipment to reduce the fabrication cost.

It is still another objective of the present invention to provide a method for forming a thin-film resistor that forms a thin-film resistor over the passivation layer, so that the resistance of the thin-film resistor can be re-modified according to the modification of device.

In accordance with the foregoing and other objectives of the present invention, the method for forming a thin-film resistor according to the invention includes forming two insulators on the thin-film resistor, and forming contact holes by performing wet etching processes.

In accordance with the foregoing and other objectives of the present invention, the invention provides another method for forming a thin-film resistor that forms a thin-film resistor over the passivation layer. That is, forming a thin-film resistor on the top of the device, so that the resistance can be re-modified according to the actual needs.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new method for forming a thin-film resistor as shown in FIGS. 2A through 2F.

Figure 1A:
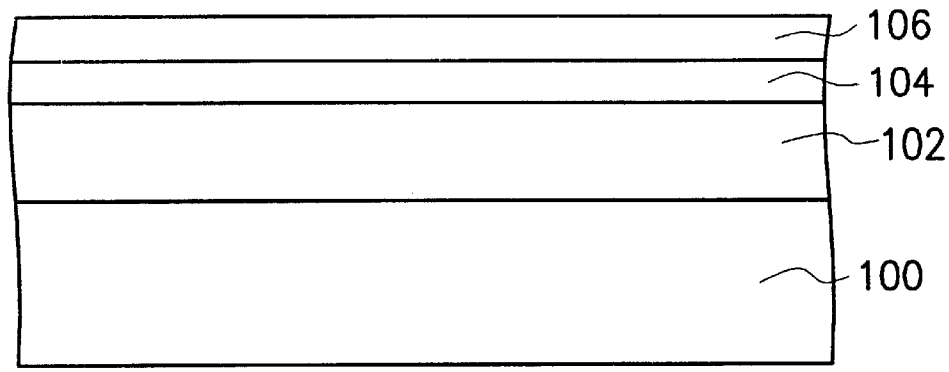
FIGS. 1A through 1I are schematic cross-sectional views showing a conventional method for forming a thin-film resistor.
Figure 1B:
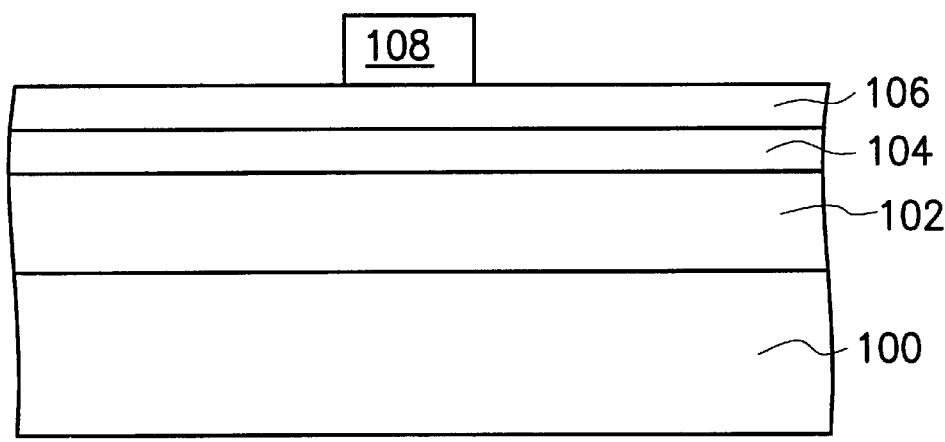
Figure 1C:
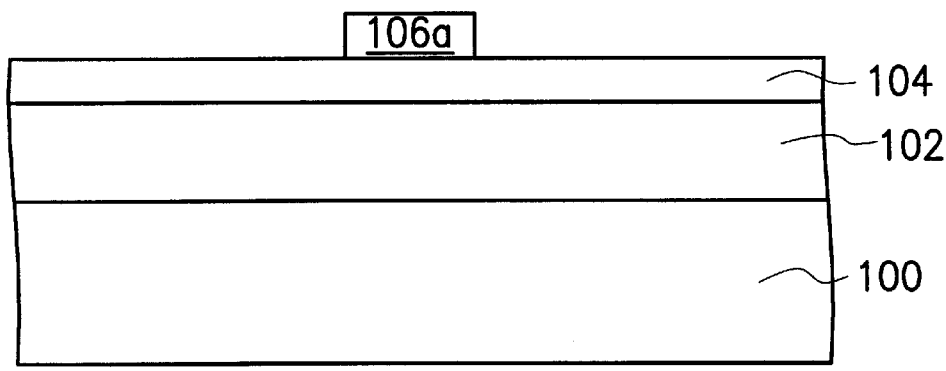
Figure 1D:
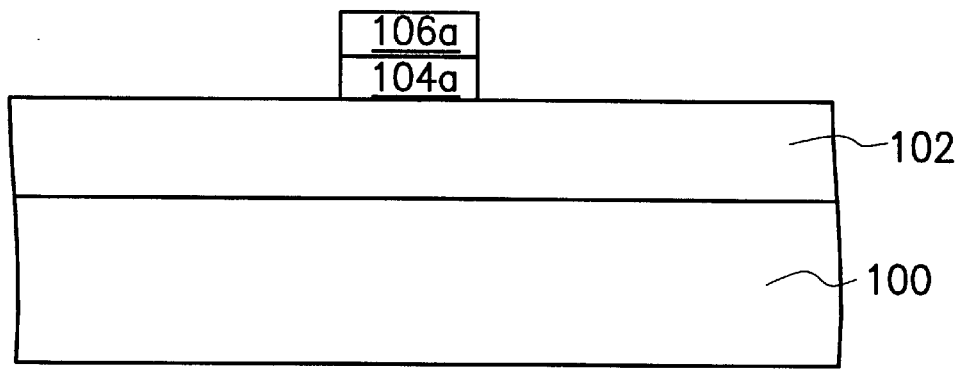
Figure 1E:
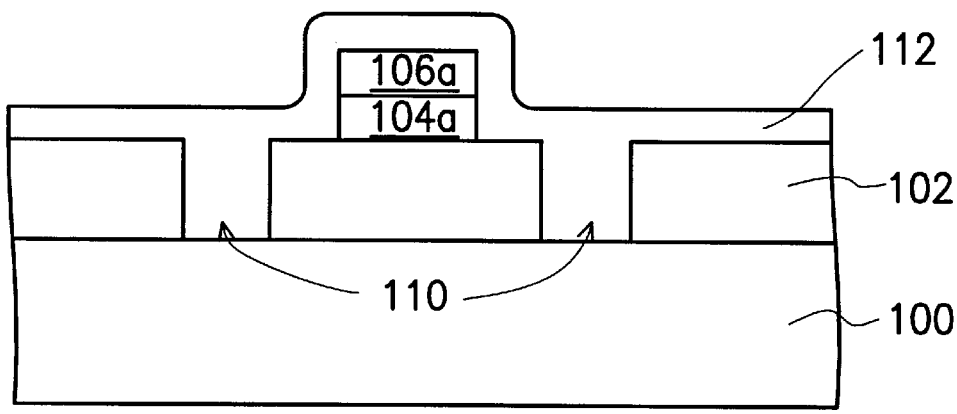
Figure 1F:
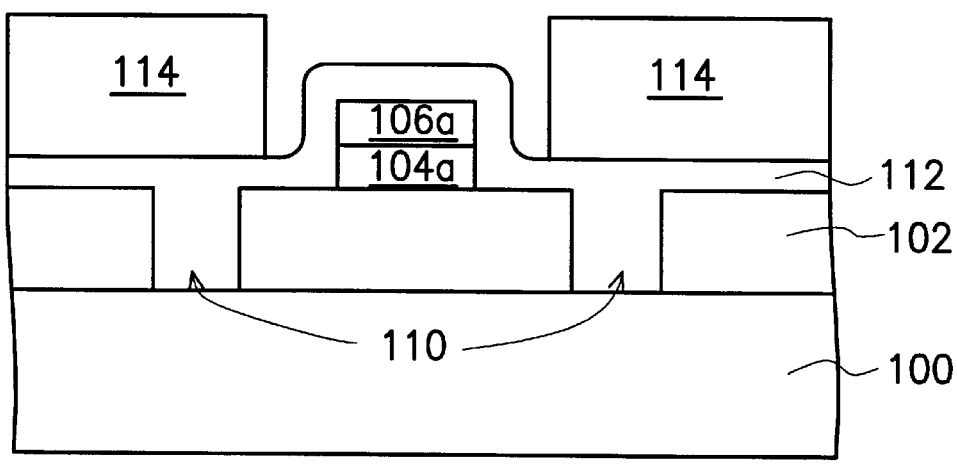
Figure 1G:
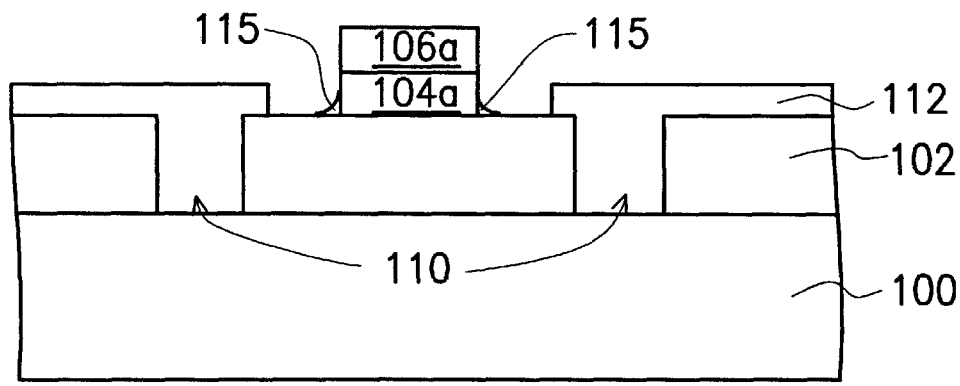
Figure 1H:
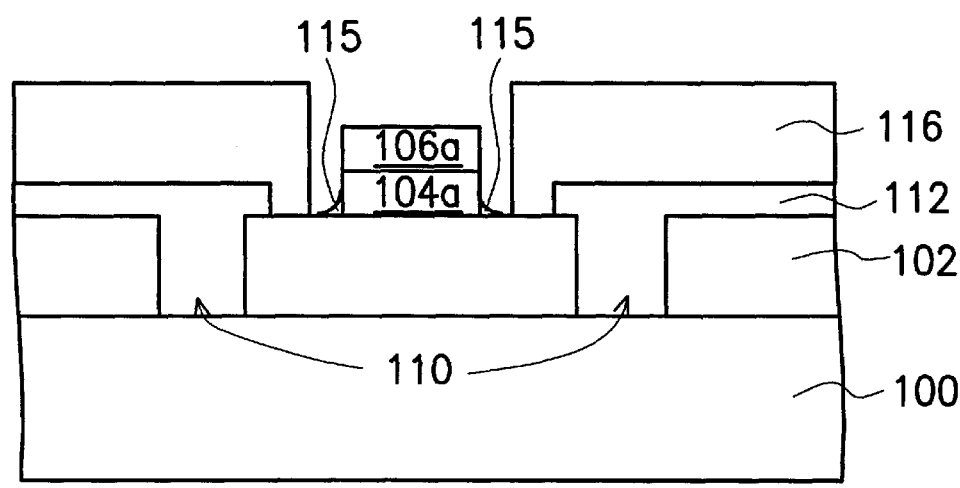
Figure 1I:
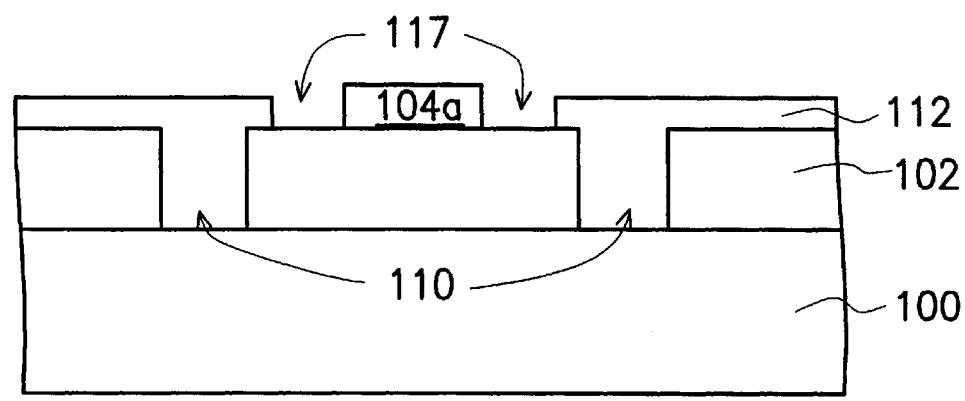
Figure 2A:
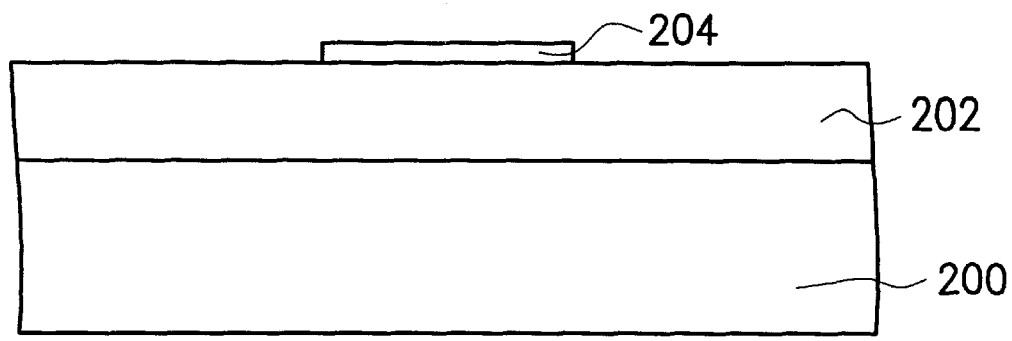
FIGS. 2A through 2F are schematic cross-sectional showing the method for forming a thin-film resistor of a preferred embodiment according to the invention.

Referring to FIG. 2A, a patterned thin-film resistor 204 is formed on an insulator 202, wherein the thin-film resistor 204 can be SiCr sputtered on the insulator 202 at a temperature of about 300° C., and is patterned by a etching process. The insulator 202 is borophosphosilicate glass (BPSG), or other material with similar properties, formed on a substrate 200, wherein the substrate 200 contains pre-formed devices (not shown in figure). The resistance of the thin-film resistor 204 is tested and properly defined.

Figure 2B:
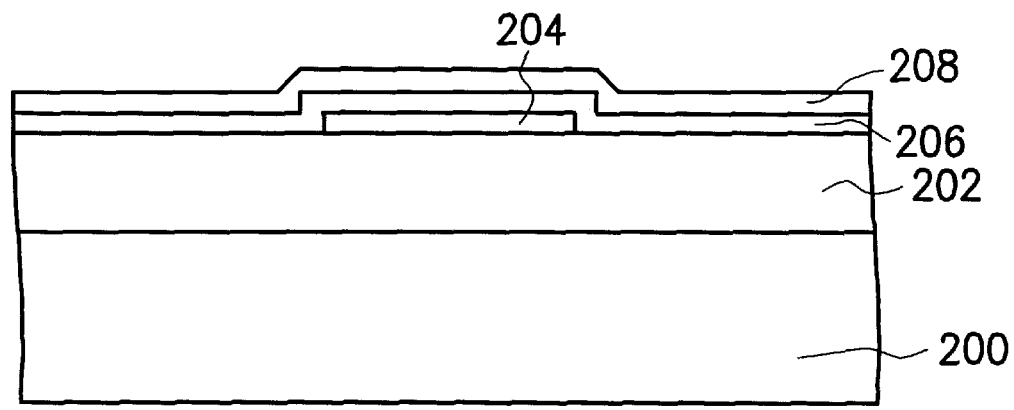

Referring next to FIG. 2B, a first insulator 206 is formed on the substrate and the thin-film resistor 204. The first insulator 206 can be silicon nitride formed by atmosphere-pressure chemical vapor deposition. Other material with similar properties formed by a various process can also be used. Then, a second insulator 208 is formed on the first insulator 206. The second insulator 208 can be silicon oxide formed by atmosphere-pressure chemical vapor deposition. Similarly, Other material with similar properties formed by a various process can also be used as the second insulator.

Figure 2C:
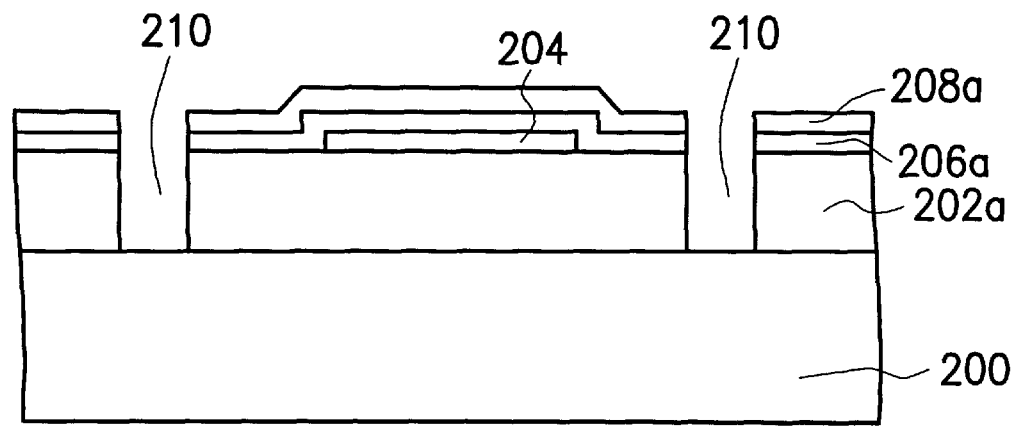

A conventional photolithography and etching process is performed to form a contact hole 210 that exposes certain devices formed on the substrate 200, as shown in FIG. 2C.

Figure 2D:
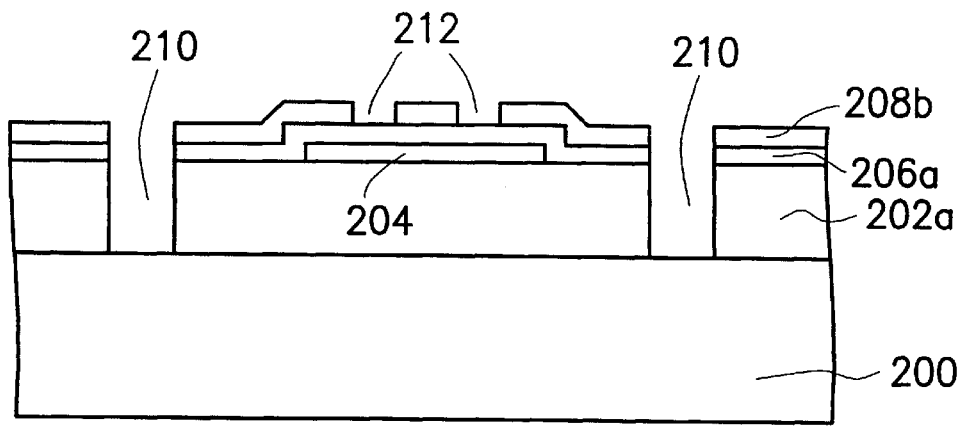
Figure 2E:
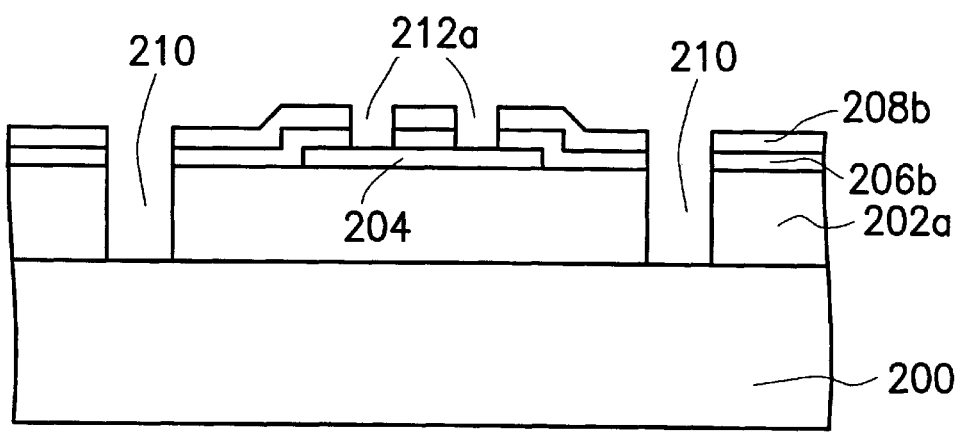

As referring next to FIGS. 2D and 2E, a patterning process is performed to form contact hole 212 on the second insulator 208a to expose the first insulator 206a underneath. The patterning process includes laying and patterning a photoresist layer (not shown in figure) on the substrate 200, and performing an etching process to remove a portion of the second insulator 208a, wherein the etching process includes a wet etching process. Then, as using the patterned second insulator 208b as a mask, another etching process is performed to further deepen the contact hole 212 to expose the thin-film resistor 204. The etching process performed to form the contact hole 212a can be a wet etching process of using $H_3PO_4$ as an etchant.

Figure 2F:
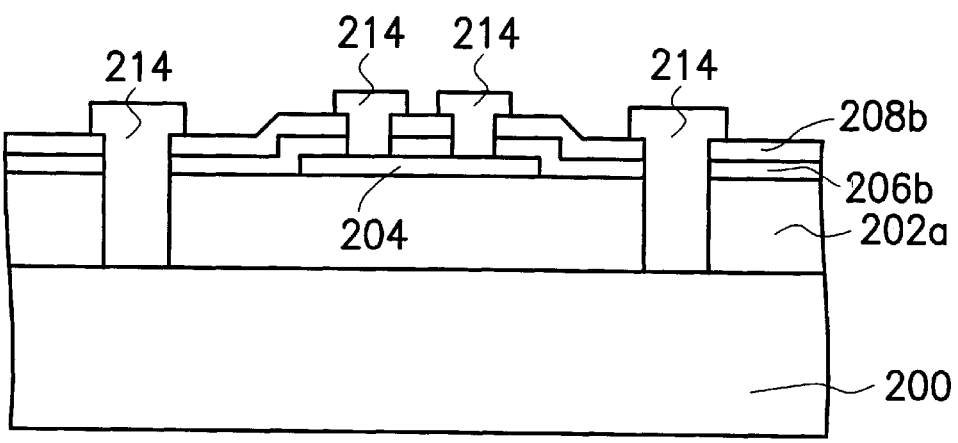

Referring to FIG. 2F, a metallization process is performed to form plugs in the contact holes 210 and 212a, and the interconnect connected thereto.

According to the foregoing, two wet etching processes of using proper etchants are performed to form the contact hole 212a that exposes the thin-film resistor 204, so the damages on the thin-film resistor caused by conventional dry etching processes is eliminated. The etchants are selected accordingly to the materials forming the insulators 206 and 208.

In addition, the conducting layer is formed next to the formation of the thin-film resistor, the problems of a conventional method caused by remaining conductive materials is avoided.

The contact holes 212a and 210 are filled to form contact plugs at the same time, therefore, the fabrication process is shortened.

FIGS. 3A through 3E are schematic cross-sectional views showing a method for forming a thin-film resistor of another preferred embodiment according to the invention.

Figure 3A:
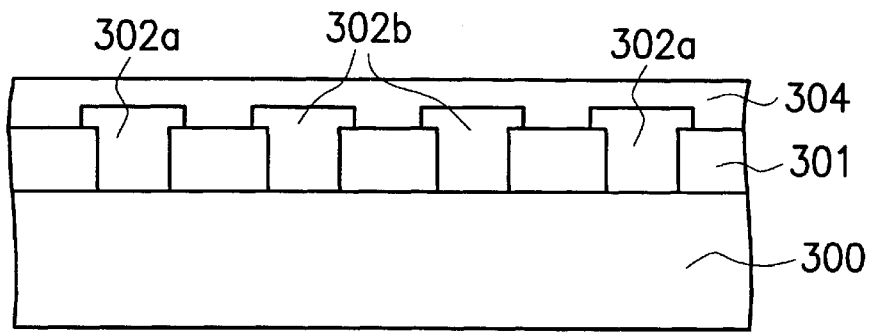
FIGS. 3A through 3D are schematic cross-sectional showing the method for forming a thin-film resistor of another preferred embodiment according to the invention.

As shown in FIG. 3A, a provided substrate 300 contains pre-formed devices (not shown in figure), an insulator 301, metal layer 302a, 302b, and a planarized passivation layer 304. The metal layer 302a is interconnect connecting the pre-formed devices on the substrate 300, and the metal layer 302b is interconnect connecting a thin-film resistor formed in the follow-up process.

Figure 3B:
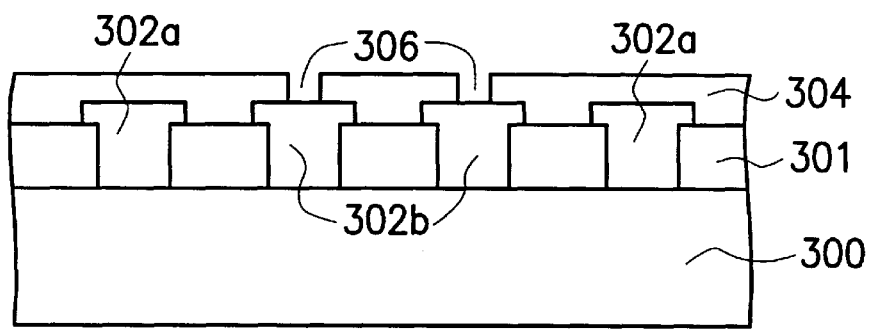

Referring to FIG. 3B, a conventional photolithography and etching process is performed to form a contact hole 306, wherein the contact hole 306 exposes the interconnect 302b.

Figure 3C:
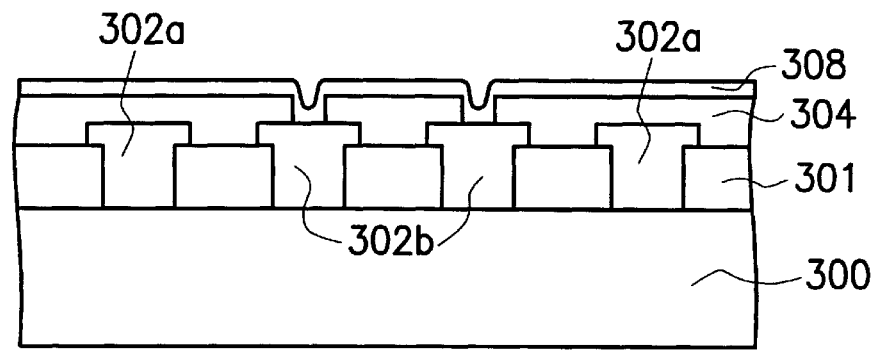

Referring next to FIG. 3C, a thin-film resistor layer 308 is formed on the passivation layer 304, wherein the thin-film resistor layer 308 also fills the contact hole 306. The thin-film resistor layer can be sputtered SiCr, or other material formed by various processes that still has similar properties.

Figure 3D:
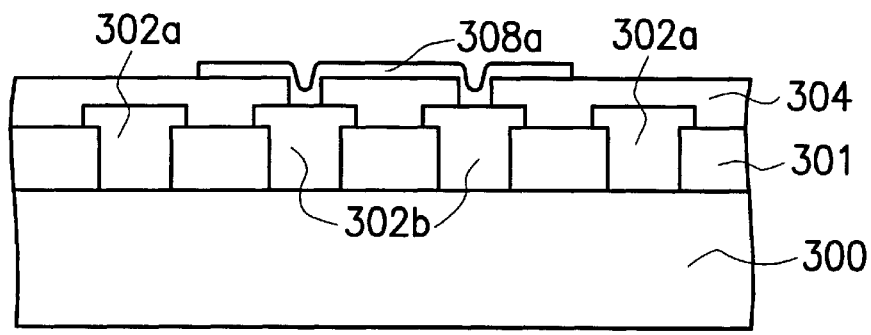

As shown in FIG. 3D, the thin-film resistor layer 308 is patterned by performing a process like dry etching process. The patterned thin-film resistor 308a is then tested and modified by a laser according to the actual needs.

In accordance with the foregoing method of the second preferred embodiment according to the invention, the thin-film resistor 308a is formed on the top of the passivation, it can be easily re-modified. Since the material like SiCr is resistant to oxidation, modifying the circuit layout to form a thin-film resistor on the top of passivation can simplify the fabrication process without affecting the electrical properties of the resistor. In addition, modifying the resistance of the thin-film resistor is easier than what formed by a conventional method, so it can be applied on the fabrication process of a highly integrated circuit.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a thin-film resistor, comprising the steps of:

providing a substrate having a first insulator disposed thereon;

forming a thin-film resistor layer on the first insulator;

patterning the thin-film resistor layer to form a thin-film, resistor;

forming a second insulator on the substrate and the thin-film resistor;

forming a third insulator on the second insulator;

forming a first contact hole through said second and third insulators to expose a first region of said substrate;

forming a second contact hole through said second and third insulators to expose a second region of said thin-film resistor, wherein said third insulator masks the second insulator in forming said second contact hole; and forming first and second interconnects by performing a metallization process to fill the first contact hole and the second contact hole with metal, respectively.

2. The method of claim 1, wherein the first insulator includes borophosphosilicate glass (BPSG).

3. The method of claim 1, wherein the second insulator includes silicon nitride.

4. The method of claim 3, wherein the third insulator includes oxide.

5. The method of claim 4, wherein the step of forming a second insulator includes atmosphere-pressure chemical vapor deposition.

6. The method of claim 4, wherein the step of forming a third insulator includes atmosphere-pressure chemical vapor deposition.

7. The method of claim 4, wherein the step of performing a contact hole process to form a second contact hole further comprises steps of:

forming photoresist layer on the third insulator, wherein the photoresist layer is defined by a pattern;

performing a wet etching process to transfer the pattern onto the third insulator by using the photoresist layer as a mask; and performing a wet etching process to transfer the pattern onto the second insulator by using the third insulator as a mask.

8. The method of claim 7, wherein the step of performing a wet etching process to transfer the pattern onto the second insulator includes using $H_3PO_4$ as an etchant.

9. The method of claim 1, wherein the thin-film resistor includes SiCr.

10. The method of claim 9, wherein the step of forming a thin-film resistor layer on the substrate includes sputtering.

11. The method of claim 1, wherein the step of patterning the thin-film resistor layer includes dry etching.

12. The method of claim 1, wherein the second insulator includes oxide.

13. The method of claim 12, wherein the third insulator includes silicon nitride.

14. The method of claim 12, wherein the step of performing a contact hole process to form a second contact hole further comprises steps of:

forming photoresist layer on the third insulator, wherein the photoresist layer is defined by a pattern;

performing a wet etching process to transfer the pattern onto the third insulator by using the photoresist layer as a mask; and performing a wet etching process to transfer the pattern onto the second insulator by using the third insulator as a mask.

15. The method of claim 14, wherein the step of performing a wet etching process to transfer the pattern onto the third insulator includes using $H_3PO_4$ as an etchant.

16. A method for forming a thin-film resistor, comprising steps of:

providing a substrate, wherein the substrate comprises:

at least a pre-formed device formed on the substrate;

an insulator covering the substrate and the pre-formed device;

at least an interconnect formed on the insulator, wherein the interconnect is connected to the pre-formed device; and a passivation layer covering the substrate;

performing a photolithography and etching process to form a contact hole that exposes the interconnect;

forming a thin-film resistor layer on the passivation layer, wherein the thin-film resistor layer also fills the contact hole, and wherein the thin-film resistor layer is electrically connected to the interconnect through the contact hole; and patterning the thin-film resistor layer to form a thin-film resistor.

17. The method of claim 16, wherein the thin-film resistor layer includes SiCr.

18. The method of claim 17, wherein the step of forming a thin-film resistor layer includes sputtering.

19. The method of claim 16, wherein the step of patterning the thin-film resistor layer includes dry etching.

20. A method for forming a thin-film resistor, comprising steps of;

providing a substrate and a first insulator over the substrate;

forming a thin-film resistor layer on the substrate;

patterning the thin-film resistor layer to form a thin-film resistor;

forming a second insulator on the substrate and the thin-film resistor;

forming a third insulator on the second insulator;

exposing the substrate by forming a first contact hole in the first insulator;

exposing the thin-film resistor by forming a second contact hole in the second insulator and the third insulator; and simulatneously filing the first contact hole and the second contact hole with metal.

21. The method of claim 20, wherein the first insulator includes borophosphosilicate glass (BPSG).

22. The method of claim 20, wherein the second insulator includes silicon nitride.

23. The method of claim 22, wherein the third insulator includes oxide.

24. The method of claim 23, wherein the step of forming a second insulator includes atmosphere-pressure chemical vapor deposition.

25. The method of claim 23, wherein the step of forming a third insulator includes atmosphere-pressure chemical vapor deposition.

26. The method of claim 23, wherein the step of exposing the substrate further comprises steps of:

forming a photoresist layer on the third insulator, wherein the photoresist layer is defined by a pattern;

performing a wet etching process to transfer the pattern onto the third insulator by using the photoresist layer as a mask; and performing a wet etching process to transfer the pattern onto the second insulator by using the third insulator as a mask.

27. The method of claim 26, wherein the step of performing a wet etching process to transfer the pattern onto the second insulator includes using $H_2PO_4$ as an etchant.

28. The method of claim 20, wherein the thin-film resistor includes SiCr.

29. The method of claim 28, wherein the step of forming a thin-film resistor layer on the substrate includes sputtering.

30. The method of claim 20, wherein the step of patterning the thin-film resistor layer includes dry etching.

* * * * *